United States Patent
Tsukuda

[11] Patent Number: 5,838,197
[45] Date of Patent: Nov. 17, 1998

[54] HIGH-GAIN AMPLIFIER CIRCUIT HAVING VOLTAGE/CURRENT CONVERTER

[75] Inventor: Naoki Tsukuda, Tokyo, Japan

[73] Assignee: NEC Corporation, Tokyo, Japan

[21] Appl. No.: 696,061

[22] Filed: Aug. 13, 1996

[30] Foreign Application Priority Data

Aug. 14, 1995 [JP] Japan .................................. 7-228565

[51] Int. Cl.[6] ...................................................... H03F 3/45
[52] U.S. Cl. .......................................... 330/252; 330/259
[58] Field of Search ................................ 330/9, 85, 252, 330/259, 290, 310

[56] References Cited

U.S. PATENT DOCUMENTS 5,594,387   1/1997   Kagawa ................................... 330/259

FOREIGN PATENT DOCUMENTS 0556000   8/1993   European Pat. Off. .
0139362   10/1979   Japan ...................................... 330/259
2-305205   12/1990   Japan .
2120032   11/1983   United Kingdom .

*Primary Examiner*—Steven Mottola
*Attorney, Agent, or Firm*—Sughrue, Mion, Zinn, Macpeak & Seas, PLLC

[57] ABSTRACT

A high-gain amplifier circuit that can start normal operation quickly after a power supply is turned on. This circuit includes first to n-th differential amplifiers cascade-connected at first to n-th stages, a first input terminal to which a first input signal is applied, a second input terminal to which a second input signal is applied; a first output terminal from which a first output signal is derived, a second output terminal from which a second output signal is derived, and a voltage/current converter applied with the first and second output signals and producing an output current corresponding to an offset between bias components of the first and second output signals. The output current of the voltage/current converter is fed back to the first differential amplifier at the first stage, thereby canceling the offset between the bias components of the first and second output signals. This circuit is applicable to an amplitude limiter for limiting the amplitude of a received signal in a selective-calling radio receiver.

19 Claims, 6 Drawing Sheets

HIGH-GAIN AMPLIFIER CIRCUIT HAVING VOLTAGE/CURRENT CONVERTER

BACKGROUND OF THE INVENTION

1. Field of the Invention

The present invention relates to an amplifier circuit and more particularly, to a high-gain amplifier circuit applicable to an amplitude limiter for limiting the amplitude of a received signal in a selective-calling radio receiver.

2. Description of the Prior Art

Typically, a selective-calling radio receiver such as a pager has an amplifier circuit applied with a stabilized bias voltage in order to limit the amplitude of a received signal within a specific level, which is termed an "amplitude limiter circuit". A conventional amplitude limiter circuit of this sort is shown in FIG. 1.

As shown in FIG. 1, this conventional amplitude limiter circuit 400 is equipped with first to third differential amplifiers 401, 402 and 403 cascade-connected at first to third stages, a positive-phase input terminal 411 to which a positive-phase input voltage $V_{IN1}$ is applied, a negative-phase input terminal 412 to which a negative-phase input voltage $V_{IN2}$ is applied, a positive-phase output terminal 413 from which a first output voltage $V_{OUT1}$ is derived, and a negative-phase output terminal 414 from which a second output voltage $V_{OUT2}$ is derived The first differential amplifier 401 at the first stage receives the positive- and negative-phase input voltages $V_{IN1}$ and $V_{IN2}$ applied through the positive- and negative-phase input terminals 411 and 412. The amplifier 401 amplifies a differential input voltage $V_{IN}$ at a specific gain, thereby outputting a differential output voltage $V_{O1}$ to the second differential amplifier 402 at the second stage. Here, the differential input voltage $V_{IN}$ is defined as the difference between the positive- and negative-phase input voltages $V_{IN1}$ and $V_{IN2}$; i.e., $V_{IN}=V_{IN1}-V_{IN2}$.

The second differential amplifier 402 at the second stage amplifies the differential output voltage $V_{O1}$ from the first differential amplifier 402 at a specific gain, thereby outputting a differential output voltage $V_{O2}$ to the third differential amplifier 403 at the third stage.

The third differential amplifier 403 at the third stage amplifies the differential output voltage $V_{O2}$ from the second differential amplifier 402 at a specific gain, thereby producing a positive-phase output voltage $V_{OUT1}$ at the positive-phase output terminal 413 and a negative-phase output voltage $V_{OUT2}$ at the negative-phase output terminal 414. In other words, the amplifier 403 outputs a differential output voltage $V_{OUT}$ from the positive- and negative-phase output terminals 413 and 414, where the differential output voltage $V_{OUT}$ is defined as the difference between the positive- and negative-phase output voltages $V_{OUT1}$ and $V_{OUT2}$; i.e., $V_{OUT}=V_{OUT1}-V_{OUT2}$.

The conventional amplitude limiter circuit 400 is further equipped with a first low-pass filter including a resistor 404 and a capacitor 406, and a second low-pass filter including a resistor 405 and a capacitor 407. The first and second low-pass filters constitute a feedback subcircuit of the cascaded differential amplifiers 401, 402 and 403.

One end of the resistor 404 is connected to the positive-phase output terminal 413 and the other end thereof is connected to the negative-phase input terminal 412. One end of the capacitor 406 is connected to the end of the resistor 404 located at the input terminal 412 and the other end thereof is connected to the ground.

Similarly, one end of the resistor 405 is connected to the negative-phase output terminal 414 and the other end thereof is connected to the positive-phase input terminal 411. One end of the capacitor 407 is connected to the end of the resistor 405 located at the input terminal 411 and the other end thereof is connected to the ground The positive-phase output voltage $V_{OUT1}$ is negatively fed back to a negative-phase input terminal of the first differential amplifier 401 through the first low-pass filter. The signal component of the output voltage $V_{OUT1}$ is removed by the first filter. Therefore, only the bias component of the positive-phase output voltage $V_{OUT1}$ is negatively fed back to the first differential amplifier 401.

Similarly, the negative-phase output voltage $V_{OUT2}$ is negatively fed back to a positive-phase input terminal of the first differential amplifier 401 through the second low-pass filter. The signal component of the output voltage $V_{OUT2}$ is removed by the second filter. Therefore, only the bias component of the negative-phase output voltage $V_{OUT2}$ is negatively fed back to the first differential amplifier 401.

As described above, with the conventional amplitude limiter circuit 400, since the bias components of the positive- and negative-phase output voltages $V_{OUT1}$ and $V_{OUT2}$ are negatively fed back to the input side of the first differential amplifier 401 through the first and second low-pass filters, any bias offset generated between the positive- and negative-phase output terminals 413 and 414 can be canceled. This means, that the differential amplifiers 401, 402 and 403 are biased stably, resulting in the wanted amplitude limitation of the received signal within a specified level.

To reduce the power consumption, the selective-calling radio receiver containing the conventional amplitude limiter circuit 400 has usually adopted the intermittent receiving method. In this method, the receiver is usually held in the "standby mode" where the receiver is kept on standby to restrict the power consumption as low as possible. The receiver turns from the standby mode to the "operation mode" upon receipt of a specific radio signal. In the operation mode, the receiver performs the normal receiving behavior under the supply of a specific power supply voltage.

With the conventional amplitude limiter circuit 400 in FIG. 1, however, a problem that the receiver is prevented from receiving a transmitted signal at the switching from the standby mode to the operation mode occurs. This problem is caused by the fact that a long time is necessary for the receiver to turn from the standby mode to the operation mode due to the existence of the capacitors 406 and 407.

Specifically, supposing that the resistors 404 and 405 have the same resistance R and the capacitors 406 and 407 have the same capacitance C, the first and second low-pass filters have the same cut-off frequency $f_c$ which is defined as $f_c=1/(2\pi RC)$. In this case, the first and second filters have the same rise time $t_r$ of 2.2 CR. For example, if the cut-off frequency $f_c$ is 5 Hz, the rise time $t_r$ is 70 ms.

The rise time $t_r$ is typically defined as the time necessary for a signal to increase from the value of 10% of the amplitude to the value of 90% thereof. Accordingly, it is clear that the signal will take a longer time than the rise time $t_r$ to increase from the value of 0% of the amplitude to the value of 100% thereof.

When the receiver turns from the standby mode to the operation mode at the time $T_0$, the driving voltage $V_{POWER}$ for the limiter circuit 400 is immediately raised from zero to $V_{CC}$, as shown in FIG. 2A, where $V_{CC}$ is a power supply voltage of the radio receiver. At this time, the positive- and negative-phase input voltages $V_{IN1}$ and $V_{IN2}$ start to be applied to the positive- and negative-input terminals 411 and 412, respectively.

Since the capacitors 406 and 407 need to be charged at the switching behavior, the bias components of the output voltages $V_{OUT1}$ and $V_{OUT2}$ do not reach respective preset values until the capacitors 406 and 407 are fully charged.

FIG. 2C shows the change of the bias component $V_{BIAS1}$ of the output voltage $V_{OUT1}$, in which the bias component $V_{BIAS1}$ increases gradually with the time and does not reach the preset value $V_B$ until the capacitors 406 and 407 are fully charged at the time $T_1$. Due to this change of the bias component $V_{BIAS1}$, the output voltages $V_{OUT1}$ changes as shown in FIG. 2B, in which the output voltages $V_{OUT1}$ contains the signal component at the time when the bias component $V_{BIAS1}$ increases to a value near $V_B$ or later.

Although not shown here, the change of the output voltage $V_{OUT2}$ and its bias component are almost the same as those shown in FIGS. 2B and 2C except that they have an opposite phase to that of the output voltage $V_{OUT1}$ and its bias component $V_{BIAS1}$.

It is seen from FIGS. 2B and 2C that the circuit 400 starts to receive normally the transmitted signal after a delay of approximately $(T_1-T_0)$.

Thus, with the conventional amplitude limiter circuit 400, the above problem relating to the prevention of receiving the transmitted signal occurs.

To solve this problem, an additional charging circuit may be provided for quickly charging the capacitors 406 and 407. In this case, the input voltage $V_{IN1}$ and its bias component $V_{BIAS1}$ will change in the manner as shown in FIGS. 2D and 2E, respectively, where the time $T_2$ is earlier than the time $T_1$ with respect to the time $T_0$.

However, the additional charging circuit causes another problem that the circuit scale increases.

Further, since the charging circuit is unable to charge the capacitors 406 and 407 instantaneously, this charging circuit cannot reduce satisfactorily the switching or returning time from the standby mode to the operation mode.

SUMMARY OF THE INVENTION

Accordingly, an object of the present invention is to provide a high-gain amplifier circuit that can start the normal operation quickly after a power supply is turned on without any additional charging circuit.

The above object together with others not specifically mentioned will become clear to those skilled in the art from the following description.

A high-gain amplifier circuit according to the present invention comprises first to n-th differential amplifiers cascade-connected at first to n-th stages where n is an integer greater than unity, a first input terminal to which a first input signal is applied, a second input terminal to which a second input signal is applied, a first output terminal from which a first output signal is derived, and a second output terminal from which a second output signal is derived.

The first and second input signals are inputted into the first differential amplifier at the first stage through the first and second input terminals, respectively. The first and second output signals are outputted from the n-th differential amplifier at the n-th stage through the first and second output terminals, respectively.

The high-gain amplifier circuit according to the present invention further comprises a voltage/current converter applied with the first and second output signals and producing an output current corresponding to an offset between bias components of the first and second output signals.

The output current of the voltage/current converter is fed back to the first differential amplifier at the first stage, thereby canceling the offset between the bias components of the first and second output signals.

With the high-gain amplifier circuit according to the present invention, the first and second output signals are applied across input terminals of the voltage/current converter amplifier. The voltage/current converter supplies the output current to the first differential amplifier, thereby canceling the offset voltage generated between the bias components of the first and second output signals. This means that the bias components of the first and second output signals are controlled to be kept equal to each other.

Accordingly, even if a capacitor for a low-pass filter is connected to link the input terminals of the voltage/current converter, the ends of the capacitor will be applied with the equal bias components of the first and second output signals, respectively. This means that the capacitor is not required to be charged at the start of operation.

As a result, the high-gain amplifier circuit according to the present invention can start the normal operation quickly after a power supply is turned on without any additional charging circuit.

In a preferred embodiment of the circuit according to the invention, a low-pass filter having a first resistor, a second resistor and a capacitor is provided.

The voltage/current converter has a first input terminal to which the first output signal is applied and a second input terminal to which the second output signal is applied. The first output signal is inputted into the first input terminal of the voltage/current converter through the first resistor, and the second output signal is inputted into the second input terminal thereof through the second resistor. The capacitor is connected to link the first and second input terminals of the voltage/current converter.

In another preferred embodiment of the circuit according to the invention, the voltage/current converter has a differential amplifier including a pair of first and second transistors whose emitters are coupled together and a constant current source for driving the pair. The output current of the voltage/current converter is taken out from a collector of one of the first and second transistors.

An additional advantage that the voltage/current converter is realized with a simple configuration occurs.

In still another preferred embodiment of the circuit according to the invention, each of the first and second output signals has a limited amplitude whose peak is equal to a supply voltage. In this case, the circuit according to the invention can be used as an amplitude limiter circuit.

In a further preferred embodiment of the circuit according to the invention, one of the first and second input signals is a received signal of a selective-calling radio receiver.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
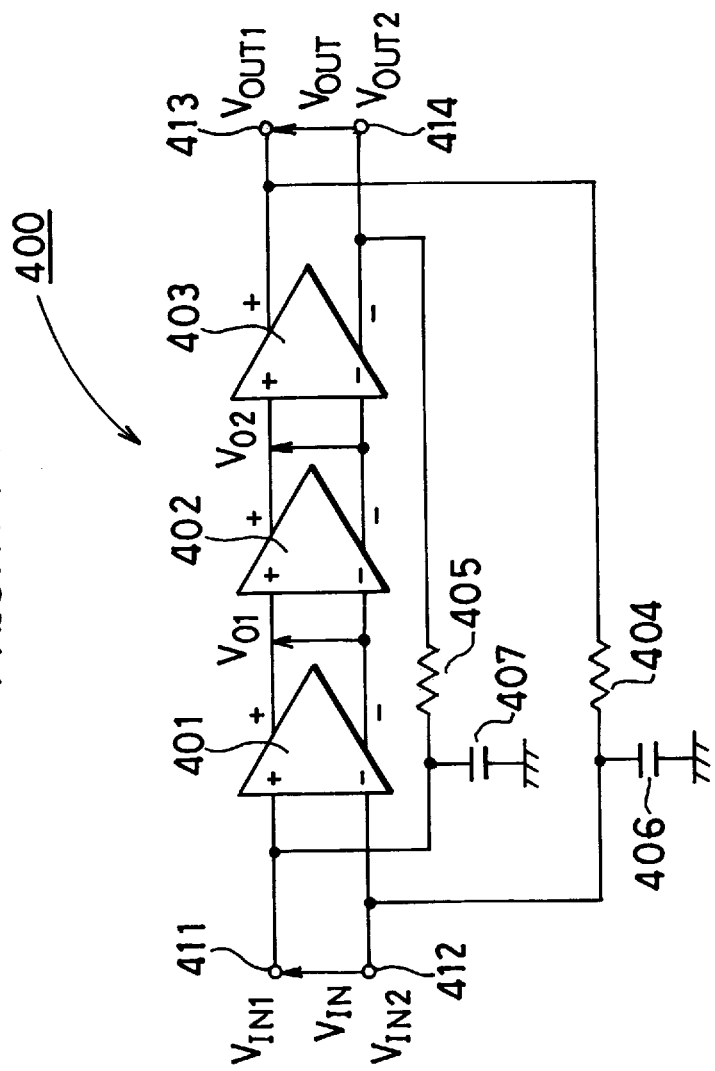
FIG. 1 is a schematic circuit diagram of a conventional amplitude limiter circuit.

Preferred embodiments of the present invention will be described in detail below while referring to the drawings attached.

Figure 3:
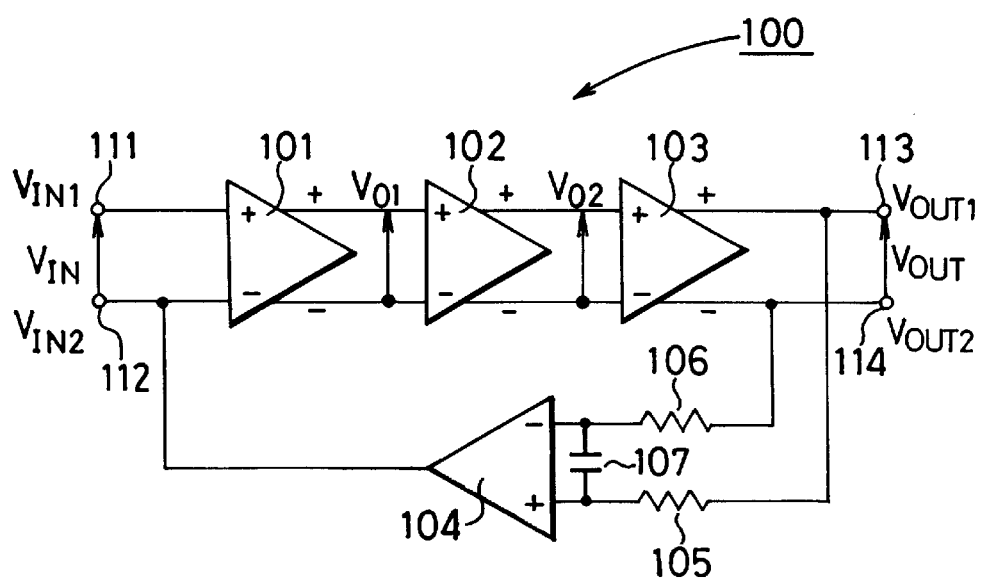
FIG. 3 is a schematic circuit diagram of an amplitude limiter circuit according to an embodiment of the present invention.

A high-gain amplifier circuit 100 according to an embodiment of the invention has a configuration as shown in FIG. 3, which is used for an amplitude limiter of a selective-calling radio receiver.

As shown in FIG. 3, this high-gain amplifier circuit 100 is equipped with first to third differential amplifiers 101, 102 and 103 cascade-connected at first to third stages, a voltage/current converter 104, two resistors 105 and 106, a capacitor 107, a positive-phase input terminal 111 to which a positive-phase input voltage $V_{IN1}$ is applied, a negative-phase input terminal 112 to which a negative-phase input voltage $V_{IN2}$ is applied, a positive-phase output terminal 113 from which a first output voltage $V_{OUT1}$ is derived, and a negative-phase output terminal 114 from which a second output voltage $V_{OUT2}$ is derived.

The first differential amplifier 101 at the first stage receives the positive- and negative-phase input voltages $V_{IN1}$ and $V_{IN2}$ applied through the positive- and negative-phase input terminals 111 and 112. The amplifier 101 amplifies a differential input voltage $V_{IN}$ at a specific gain, thereby outputting a differential output voltage $V_{O1}$ to the second differential amplifier 102 at the second stage, where $V_{IN}=V_{IN1}-V_{IN2}$.

The second differential amplifier 102 at the second stage amplifies the differential output voltage $V_{O1}$ from the first differential amplifier 101 at a specific gain, thereby outputting a differential output voltage $V_{O2}$ to the third differential amplifier 103 at the third stage.

The third differential amplifier 103 at the third stage amplifies the differential output voltage $V_{O2}$ from the second differential amplifier 102 at a specific gain, thereby producing a positive-phase output voltage $V_{OUT1}$ at the positive-phase output terminal 113 and a negative-phase output voltage $V_{OUT2}$ at the negative-phase output terminal 114. In other words, the amplifier 103 outputs a differential output voltage $V_{OUT}$ from the positive- and negative-phase output terminals 113 and 114, where $V_{OUT}=V_{OUT1}-V_{OUT2}$.

The above configuration is the same as that of the conventional amplitude limiter circuit 400 shown in FIG. 1.

Unlike the conventional amplitude limiter circuit 400 shown in FIG. 1, the high-gain amplifier circuit 100 according to the invention comprises the voltage/current converter 104.

The converter 104 has positive- and negative-phase input terminals to which the bias components of the positive- and negative-phase output voltages $V_{OUT1}$ and $V_{OUT2}$ are respectively applied, and an output terminal from which an output current proportional to an offset between the bias components of the output voltages $V_{OUT1}$ and $V_{OUT2}$.

To remove the signal components of the output voltages $V_{OUT1}$ and $V_{OUT2}$, a low-pass filter having two resistors 105 and 106 and a capacitor 107 is provided at the input side of the voltage/current converter 104. Due to this filter, only the bias components of the output voltages $V_{OUT1}$ and $V_{OUT2}$ are inputted into the converter 104.

The voltage/current converter 104 and the low-pass filter constitute a feedback subcircuit of the cascaded differential amplifiers 101, 102 and 103.

One end of the resistor 105 is connected to the positive-phase output terminal 113 and the other end thereof is connected to the positive-phase input terminal of the converter 104 One end of the resistor 106 is connected to the negative-phase output terminal 114 and the other end thereof is connected to the negative-phase input terminal of the converter 104.

One end of the capacitor 107 is connected to the positive-phase input terminal of the converter 104 and the other end thereof is connected to the positive-phase input terminal of the converter 104. Thus, the capacitor 107 is connected to link the positive- and negative-phase input terminals of the converter 104.

The voltage/current converter 104 is applied with the bias components of the output voltages $V_{OUT1}$ and $V_{OUT2}$ and produces an output current proportional to an offset generated between the bias components of the output voltages $V_{OUT1}$ and $V_{OUT2}$.

The output current of the voltage/current converter 104 is supplied to the negative-phase input terminal of the first differential amplifier 101 at the first stage. In other words, the output current is negatively fed back to the input side of the first differential amplifier 101. Thus, the offset between the bias components of the positive- and negative-phase output voltages $V_{OUT1}$ and $V_{OUT2}$ is canceled.

With the limiter amplifier circuit 100, the voltage/current converter 104 is applied with the positive- and negative-phase output voltages $V_{OUT1}$ and $V_{OUT2}$ and fed back its output current to the input side of to the first differential amplifier 101, thereby canceling the offset generated between the bias components of the output voltages $V_{OUT1}$ and $V_{OUT2}$. This means that the bias components of the output voltages $V_{OUT1}$ and $V_{OUT2}$ are controlled to be kept equal to each other.

Also, since the capacitor 107 for the low-pass filter is connected to link the input terminals of the voltage/current converter 104, the ends of the capacitor 107 are applied with the equal bias components of the output voltages $V_{OUT1}$ and $V_{OUT2}$. This means that the capacitor 107 is not required to be charged at the start of operation.

As a result, the high-gain amplifier circuit 100 according to the present invention can start the normal amplitude-limiting operation quickly after a power supply is turned on with no additional charging circuit.

Even if the radio receiver adopts the intermittent receiving method, the receiver can turn quickly from the standby mode to the operation mode upon receipt of a specific signal.

In the circuit 100, when the resistors 105 and 106 have the same resistance R and the capacitor 107 has a capacitance C, the low pass filter has a cut-off frequency $f_c$, which is defined as $f_c=1/(4\pi RC)$.

Figure 2A:
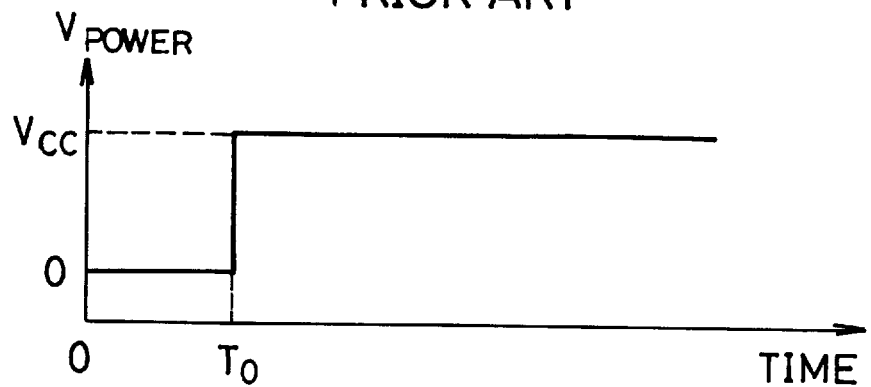
FIG. 2A is a time chart showing the change of a driving voltage for the conventional amplitude limiter circuit of FIG. 1.
Figure 2B:
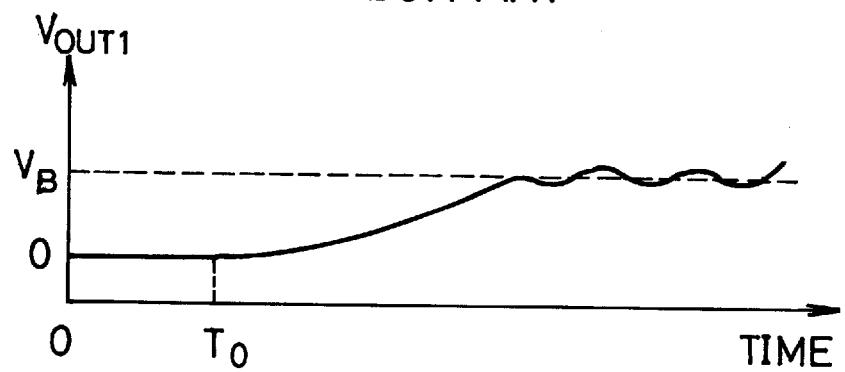
FIG. 2B is a time chart showing the positive-phase output voltage $V_{OUT1}$ of the conventional amplitude limiter circuit of FIG. 1, in which a capacitor-charging circuit is not provided.
Figure 2C:
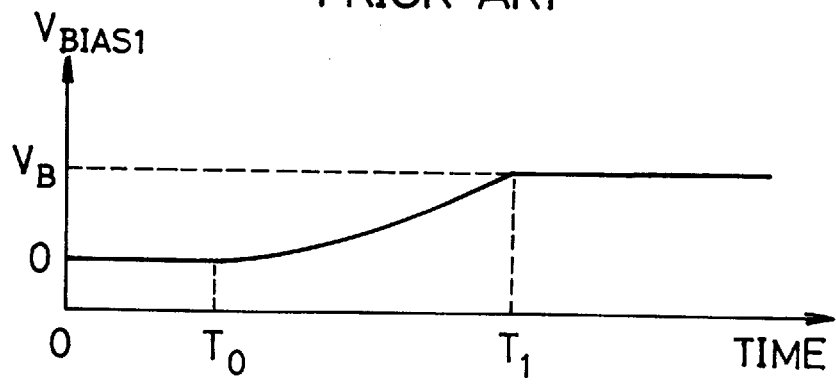
FIG. 2C is a time chart showing the bias component $V_{BIAS1}$ of the positive-phase output voltage $V_{OUT1}$ in the conventional amplitude limiter circuit of FIG. 1, in which a capacitor-charging circuit is not provided.
Figure 2D:
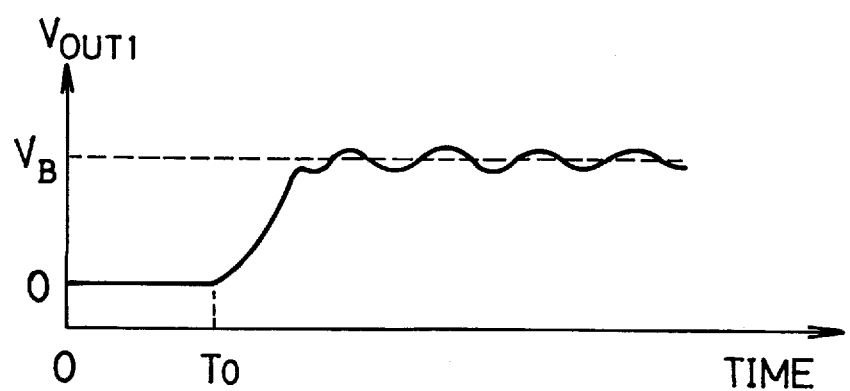
FIG. 2D is a time chart showing the positive-phase output voltage $V_{OUT1}$ of the conventional amplitude limiter circuit of FIG. 1, in which a capacitor-charging circuit is provided.
Figure 2E:
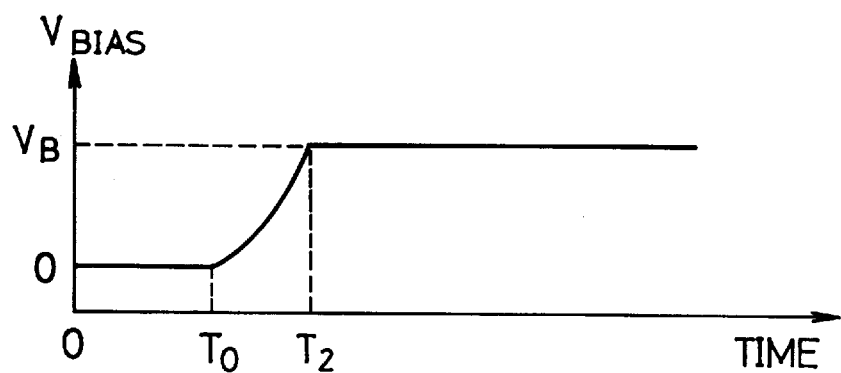
FIG. 2E is a time chart showing the bias component $V_{BIAS1}$ of the positive-phase output voltage $V_{OUT1}$ in the conventional amplitude limiter circuit of FIG. 1, in which a capacitor-charging circuit is provided.

When the receiver turns from the standby mode to the operation mode at the time $T_0$, the driving voltage $V_{POWER}$ for the limiter circuit 100 is immediately raised from zero to $V_{CC}$, as shown in FIG. 2A. At this time, the positive- and negative-phase input voltages $V_{IN1}$ and $V_{IN2}$ start to be applied to the positive- and negative-input terminals 111 and 112, respectively.

Since the capacitor 107 needs not to be charged, the bias components of the output voltages $V_{OUT1}$ and $V_{OUT2}$ reaches respective preset values approximately at the same time as that of the switching to the operation mode.

Figure 5A:
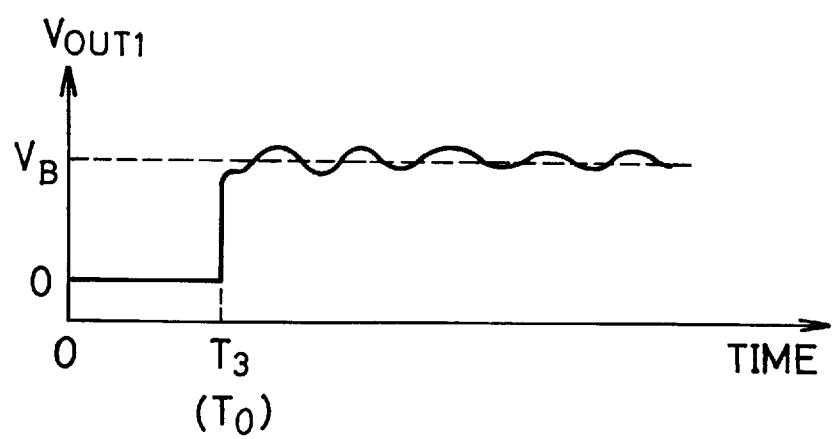
FIG. 5A is a time chart showing the positive-phase output voltage $V_{OUT1}$ of the amplitude limiter circuit according to the embodiment of the present invention.
Figure 5B:
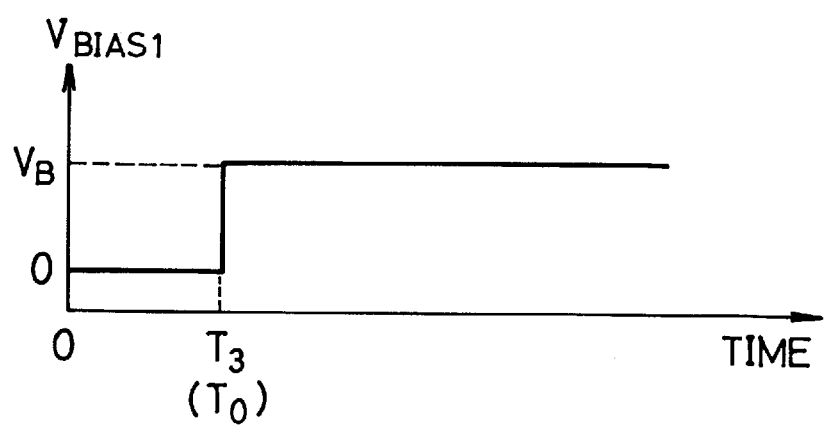
FIG. 5B is a time chart showing the bias component $V_{BIAS1}$ of the positive-phase output voltage $V_{OUT1}$ of the amplitude limiter circuit according to the embodiment of the present invention.

FIG. 5B shows the change of the bias component $V_{BIAS1}$ of the output voltage $V_{OUT1}$, in which the bias component $V_{BIAS1}$ increases abruptly and reaches the preset value $V_B$ at the time $T_3$ very close to the time $T_0$. In other words, the bias component $V_{BIAS1}$ of the output voltage $V_{OUT1}$ immediately becomes to the preset value $V_B$ at the time $T_3$ very close to the time $T_0$. Due to this change of the bias component $V_{BIAS1}$, the output voltages $V_{OUT1}$ changes as shown in FIG. 5B.

Although not shown here, the change of the output voltage $V_{OUT2}$ and its bias component are almost the same as those shown in FIGS. 5A and 5B except that they have an opposite phase to that of the output voltage $V_{OUT1}$ and its bias component $V_{BIAS1}$.

It is seen from FIGS. 5A and 5B that the circuit 100 starts to normally receive the transmitted signal after approximately no delay.

Figure 4:
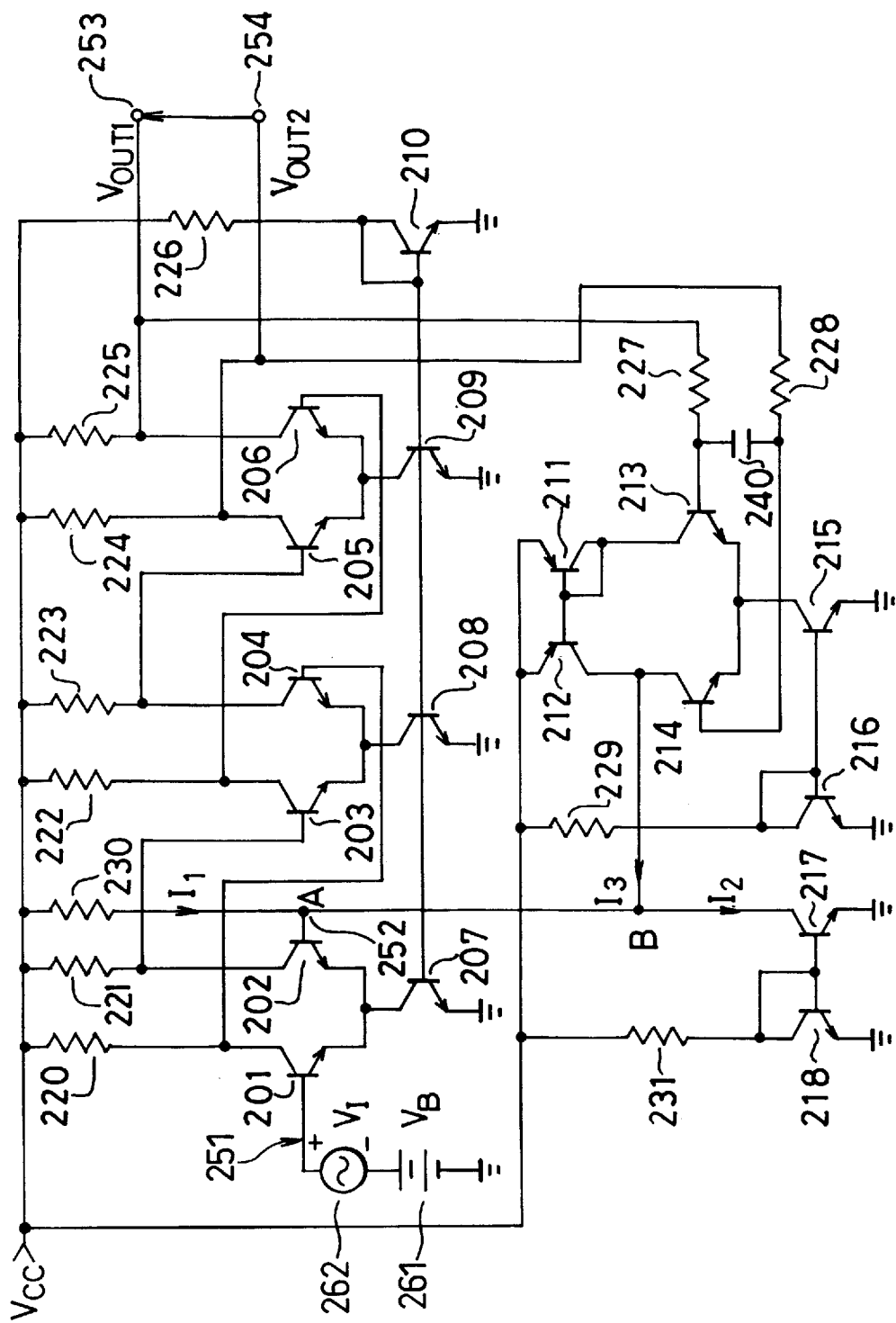
FIG. 4 is a detailed circuit diagram of the amplitude limiter circuit according to the embodiment of the present invention of FIG. 3.

FIG. 4 shows the circuit configuration of an example of the high-gain amplifier circuit 100 shown in FIG. 3.

The first differential amplifier 101 includes a pair of npn-type bipolar transistors 201 and 202, and an npn-type bipolar transistor 207 for driving the pair. Emitters of the transistors 201 and 202 are commonly connected to a collector of the transistor 207. An emitter of the transistor 207 is connected to the ground. The transistor 207 serves as a constant current source supplying a constant current to drive the pair.

A base of the transistor 201 is applied with the positive-phase input voltage $V_{IN1}$ containing the signal component $V_I$ and the dc bias component $V_B$. Here, the reference numerals 261 and 262 indicate a bias voltage source and a signal source, respectively. In other words, the base of the transistor 201 serves as the positive-phase input terminal 111.

A base of the transistor 202 is connected to a connection point A of a collector of an npn-type bipolar transistor 217 and a resistor 230. The base of the transistor 202 is applied with a voltage that varies dependent upon the voltage drop generated by a current $I_1$ flowing through the resistor 230. This voltage corresponds to the negative-phase input voltage $V_{IN2}$. The base of the transistor 202 serves as the negative-phase input terminal 112.

The transistor 217, an npn-type bipolar transistor 218 and a resistor 231 constitute a current mirror circuit for supplying a constant current $I_2$ to the resistor 230. An output current $I_3$ of the voltage/current converter 104 is supplied to the transistor 217 at a connection point B. The current $I_3$ varies proportional to a bias offset voltage generated between output terminals 253 and 254 of the circuit 100.

Therefore, the following relationship is approximately established if the current gain factors $h_{FE}$ of the transistors are sufficiently high and their base currents can be ignored.

$$I_1+I_3=I_2 \text{ (=constant)}$$

A resistor 220 is connected to a collector of the transistor 201 and a resistor 221 is connected to a collector of 20 the transistor 202. The resistors 220 and 221 serve as loads of the corresponding transistors 201 and 202, respectively.

The differential output voltage $V_{O1}$ of the first differential amplifier 101 is derived from the collectors of the transistors 201 and 202.

The second differential amplifier 102 includes a pair of npn-type bipolar transistors 203 and 204, and an npn-type bipolar transistor 208 for driving the pair. Emitters of the transistors 203 and 204 are commonly connected to a collector of the transistor 208. An emitter of the transistor 208 is connected to the ground. The transistor 208 serves as a constant current source supplying a constant current to drive the pair.

Bases of the transistors 203 and 204 are applied with the differential output voltage $V_{O1}$ from the first differential amplifier 101.

A resistor 222 is connected to a collector of the transistor 203 and a resistor 223 is connected to a collector of the transistor 204. The resistors 222 and 223 serve as loads of the corresponding transistors 203 and 204, respectively.

The differential output voltage $V_{O2}$ of the second differential amplifier 102 is derived from the collectors of the transistors 203 and 204.

The third differential amplifier 103 includes a pair of npn-type bipolar transistors 205 and 206, and an npn-type bipolar transistor 209 for driving the pair. Emitters of the transistors 205 and 206 are commonly connected to a collector of the transistor 209. An emitter of the transistor 209 is connected to the ground. The transistor 209 serves as a constant current source supplying a constant current to drive the pair.

Bases of the transistors 205 and 206 are applied with the differential output voltage $V_{O2}$ from the second differential amplifier 102.

A resistor 224 is connected to a collector of the transistor 205 and a resistor 225 is connected to a collector of the transistor 206. The resistors 224 and 225 serve as loads of the corresponding transistors 205 and 206, respectively.

The collector of the transistor 206 is further connected to a positive-phase output terminal 253 corresponding to the positive-phase output terminal 113. The collector of the transistor 205 is further connected to a negative-phase output terminal 254 corresponding to the negative-phase output terminal 114.

The differential output voltage $V_{O3}$ of the third differential amplifier 103 is derived from the collectors of the transistors 205 and 206.

An npn-type bipolar transistor 210 whose base and collector are coupled together, a resistor 226 connected to the collector of the transistor 210, and the transistors 207, 208 and 209 whose bases are commonly connected to the base of the transistor 210 constitute a current mirror circuit. This current mirror circuit supplies the corresponding constant currents to the transistor pairs 201 and 202, 203 and 204, and 205 and 206, respectively.

The voltage/current converter 104 includes a pair of npn-type bipolar transistors 213 and 214, and an npn-type bipolar transistor 215 for driving the pair. Emitters of the transistors 213 and 214 are commonly connected to a collector of the transistor 215.

The transistor 215, an npn-type bipolar transistor 216 whose base and collector are coupled together and whose base is connected to a base of the transistor 215, and a resistor 229 connected to a collector of the transistor 216 constitute a current mirror circuit. This current mirror circuit supplies a constant current for driving the pair of the transistors 213 and 214 through the transistor 215.

The positive-phase output voltage $V_{OUT1}$, which is derived from the collector of the transistor 206, is applied to the base of the transistor 213 through a resistor 227. The negative-phase output voltage $V_{OUT2}$, which is derived from the collector of the transistor 205, is applied to the base of the transistor 214 through a resistor 228. A capacitor 240 is connected to link the bases of the transistors 213 and 214. The resistors 227 and 228 and the capacitor 240 constitute a low-pass filter and as a result, only the bias components of the positive- and negative-phase output voltages $V_{OUT1}$ and $V_{OUT2}$ are applied to the bases of the transistors 213 and 214.

Two pnp-type bipolar transistors 211 and 212 constitute a current mirror circuit serving as an active load of the pair of the transistors 213 and 214.

The output current $I_3$ of the voltage/current converter 104 is derived from the collector of the transistor 214 and is supplied to the collector of the transistor 217 through the connection point B.

Since the voltage/current converter 104 is in the form of a differential amplifier, the amplifier 104 amplifies the difference between the bias components of the output voltages $V_{OUT1}$ and $V_{OUT2}$. In other words, the amplifier 104 amplifies the bias offset between the output voltages $V_{OUT1}$ and $V_{OUT2}$ to thereby output the output current $I_3$.

The resistors 227 and 228 correspond to the resistors 105 and 106, respectively. The capacitor 240 corresponds to the capacitor 107.

With the high-gain amplifier shown in FIG. 4, the output current $I_3$ of the voltage/current converter 104 is proportional to the bias offset between the positive- and negative-phase output voltages $V_{OUT1}$ and $V_{OUT2}$. The current $I_3$ is negatively fed back to the base of the transistor 202 serving as the negative-phase input terminal 112.

When no offset voltage is generated between the output voltages $V_{OUT1}$ and $V_{OUT2}$, the output current $I_3$ becomes zero, in other words, no output current is supplied to the transistor 217 from the converter 104. In this case, the base of the transistor 202 is applied with a preset dc voltage. Therefore, the output voltages $V_{OUT1}$ and $V_{OUT2}$ are equal to the amplified input voltages.

When any offset voltage exists between the output voltages $V_{OUT1}$ and $V_{OUT2}$, the output current $I_3$ has a non-zero value. In this case, the bias voltage applied to the base of the transistor 202 is changed by the current $I_3$, thereby canceling the bias offset voltage.

Thus, the circuit shown in FIG. 4 performs the predesigned amplitude-limiting operation.

In the above embodiment, although three differential amplifiers are cascade-connected, it is needless to say that the number of the differential amplifiers is optional in the invention. Two, four or more differential amplifiers may be provided as necessary.

Further, any circuit other than the differential amplifier formed by the pair of the transistors 213 and 214 may be used as the voltage/current converter 104 if it can produce an output current corresponding to the offset between the bias components of the positive- and negative-phase output signals.

Any circuit other than the combination of the resistors 105 and 106 and the capacitor 107 may be used as the low-pass filter if it can remove the signal components of the positive- and negative-phase output signals.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A high-gain amplifier circuit comprising:

first to n-th differential amplifiers cascade-connected at first to n-th stages, where n is an integer greater than unity;

a first input terminal to which a first input signal is applied;

a second input terminal to which a second input signal is applied:

said first input signal and said second input signal being inputted into said first differential amplifier at said first stage through said first input terminal and said second input terminal, respectively;

a first output terminal from which a first output signal is derived;

a second output terminal from which a second output signal is derived;

said first output signal and said second output signal being outputted from said n-th differential amplifier at said n-th stage through said first output terminal and said second output terminal, respectively;

a voltage/current converter having a first input terminal to which said first output signal is applied and a second input terminal to which said second output signal is applied and producing an output current corresponding to an offset between bias components of said first output signal and said second output signal;

said output current of said voltage/current converter being fed back to said first differential amplifier at said first stage, thereby cancelling said offset between said bias components of said first output signal and said second output signal; and a low-pass filter having a first resistor, a second resistor and a capacitor;

wherein said first output signal is inputted into said first input terminal of said voltage/current converter through said first resistor, and said second output signal is inputted into said second input terminal of said voltage/current converter through said second resistor;

and wherein said capacitor is connected to link said first input terminal of said voltage/current converter and said second input terminal of said voltage/current converter.

2. The circuit as claimed in claim 1, wherein said voltage/current converter comprises a differential amplifier including a pair of first and second transistors whose emitters are coupled together and a constant current source for driving said pair;

and wherein said output current of said voltage/current converter is taken out from a collector of one of said first and second transistors.

3. The circuit as claimed in claim 1, wherein each of said first output signal and said second output signal has a limited amplitude whose peak is equal to a supply voltage.

4. The circuit as claimed in claim 1, wherein one of said first input signal and said second input signal is a received signal of a selective-calling radio receiver.

5. A high-gain amplifier circuit comprising:
first to n-th differential amplifiers cascade-connected at first to n-th stages, where n is an integer greater than unity;
a first input terminal to which a first input signal voltage is applied;
a second input terminal to which a second input signal voltage is applied, said second input signal voltage being opposite in phase to said first input signal voltage;
said first input signal voltage and said second input signal voltage being inputted into said first differential amplifier at said first stage through said first input terminal and said second input terminal, respectively;
a first output terminal from which a first output signal voltage is derived;
a second output terminal from which a second output signal voltage is derived, said second output signal voltage being opposite in phase to said first output signal voltage;
said first output signal voltage and said second output signal voltage being outputted from said n-th differential amplifier at said n-th stage through said first output terminal and said second output terminal, respectively;
a voltage/current converter having third and fourth input terminals and a third output terminal;
said first output signal voltage and said second output signal voltage being applied to said third and fourth input terminals of said voltage/current converter;
a filtering capacitor connected to said third and fourth input terminals for removing signal components of said first output signal voltage and said second output signal voltage;
an output current corresponding to a dc offset voltage between bias components of said first output signal voltage and said second output signal voltage being outputted from said third output terminal of said voltage/current converter;
said output current of said voltage/current converter being fed back to said first differential amplifier at said first stage, thereby canceling said dc offset voltage between said bias components of said first output signal and said second output signal;
wherein a total gain of said first to n-th differential amplifiers is determined to realize an amplitude limiting function of said first output signal voltage and said second output signal voltage.

6. A high-gain amplifier circuit comprising:
a plurality of differential amplifiers cascade-connected;
a first one of said plurality of differential amplifiers having first and second input terminals;
a last one of said plurality of differential amplifiers having first and second output terminals;
a first input signal voltage and a second input signal voltage being inputted into said first and second input terminals, respectively;
a first output signal voltage and a second output signal voltage being outputted from said first and second output terminals, respectively;
a voltage/current converter having third and fourth input terminals and a third output terminals;
a filtering capacitor connected to said third and fourth input terminals of said voltage/current converter;
said first and second output signal voltages being applied to said third and fourth input terminals of said voltage/current converter, respectively;
said filtering capacitor allows dc bias components of said first and second output signal voltages to selectively enter said voltage/current converter;
an output current corresponding to a dc offset voltage between said bias components of said first and second output signal voltages being outputted from said third output terminal of said voltage/current converter;
said output current of said voltage/current converter being fed back to said first one of said plurality of differential amplifiers, thereby canceling said dc offset voltage of said first and second output terminals.

7. A high-gain amplifier circuit designed for amplifying a received signal of a selective-calling radio receiver;
wherein said amplifier circuit is switched from a standby mode to a normal operation mode by a turn-on of a power supply;
said amplifier circuit comprising:
(a) a plurality of differential amplifiers cascade-connected;
(b) a first one of said plurality of differential amplifiers having first and second input terminals;
(c) a last one of said plurality of differential amplifiers having first and second output terminals;
(d) a first input signal voltage and a second input signal voltage being inputted into said first and second input terminals, respectively;
(e) a first amplified output signal voltage and a second amplified output signal voltage being outputted from said first and second output terminals, respectively;
(f) a voltage/current converter having third and fourth input terminals and a third output terminal;
(g) a filtering capacitor connected to said third and fourth input terminal of said voltage/current converter;
said first and second output signal voltages being applied to said third and fourth input terminals of said voltage/current converter, respectively;
said filtering capacitor allows dc bias components of said first and second output signal voltages to selectively enter said voltage/current converter;
(h) an output current corresponding to a dc offset voltage between said bias components of said first and second output signal voltages being outputted from said third output terminals of said voltage/current converter; and
said output current of said voltage/current converter being fed back to said first one of said plurality of differential amplifiers, thereby canceling said dc offset voltage at said first and second output terminals;
wherein said bias components of said first and second output voltages are kept equal to one another at each switching time from said standby mode to said normal operation mode, resulting in no current flowing through said filtering capacitor.

8. The circuit as claimed in claim 5, further comprising a low-pass filter having a first resistor, a second resistor and a capacitor;
wherein said voltage/current converter has a first input terminal to which said first output signal is applied and a second input terminal to which said second output signal is applied;

and wherein said first output signal is inputted into said first input terminal of said voltage/current converter through said first resistor, and said second output signal is inputted into said second input terminal of said voltage/current converter through said second resistor;

and wherein said capacitor is connected to link said first input terminal of said voltage/current converter and said second input terminal thereof.

9. The circuit as claimed in claim 5, wherein said voltage/current converter comprises a differential amplifier including a pair of first and second transistors whose emitters are coupled together and a constant current source for driving said pair;

and wherein said output current of said voltage/current converter is taken out from a collector of one of said first and second transistor.

10. The circuit as claimed in claim 5, wherein each of said first output signal and said second output signal has a limited amplitude whose peak is equal to a supply voltage.

11. The circuit as claimed in claim 5, wherein one of said first input signal and said second input signal is a received signal of a selective-calling radio receiver.

12. The circuit as claimed in claim 6, further comprising a low-pass filter having a first resistor, a second resistor and a capacitor;

wherein said voltage/current converter has a first input terminal to which said first output signal is applied and a second input terminal to which said second output signal is applied;

and wherein said first output signal is inputted into said first input terminal of said voltage/current converter through said first resistor, and said second output signal is inputted into said second input terminal of said voltage/current converter through said second resistor;

and wherein said capacitor is connected to link said first input terminal of said voltage/current converter and said second input terminal thereof.

13. The circuit as claimed in claim 6, wherein said voltage/current converter comprises a differential amplifier including a pair of first and second transistors whose emitters are coupled together and a constant current source for driving said pair;

and wherein said output current of said voltage/current converter is taken out from a collector of one of said first and second transistor.

14. The circuit as claimed in claim 6, wherein each of said first output signal and said second output signal has a limited amplitude whose peak is equal to a supply voltage.

15. The circuit as claimed in claim 6, wherein one of said first input signal and said second input signal is a received signal of a selective-calling radio receiver.

16. The circuit as claimed in claim 7, further comprising a low-pass filter having a first resistor, a second resistor and a capacitor;

wherein said voltage/current converter has a first input terminal to which said first output signal is applied and a second input terminal to which said second output signal is applied;

and wherein said first output signal is inputted into said first input terminal of said voltage/current converter through said first resistor, and said second output signal is inputted into said second input terminal of said voltage/current converter through said second resistor;

and wherein said capacitor is connected to link said first input terminal of said voltage/current converter and said second input terminal thereof.

17. The circuit as claimed in claim 7, wherein said voltage/current converter comprises a differential amplifier including a pair of first and second transistors whose emitters are coupled together and a constant current source for driving said pair;

and wherein said output current of said voltage/current converter is taken out from a collector of one of said first and second transistor.

18. The circuit as claimed in claim 7, wherein each of said first output signal and said second output signal has a limited amplitude whose peak is equal to a supply voltage.

19. The circuit as claimed in claim 7, wherein one of said first input signal and said second input signal is a received signal of a selective-calling radio receiver.

\* \* \* \* \*

UNITED STATES PATENT AND TRADEMARK OFFICE
CERTIFICATE OF CORRECTION

PATENT NO. : 5,838,197
DATED : November 17, 1998
INVENTOR(S) : Naoki Tsukuda

It is certified that error appears in the above-identified patent and that said Letters Patent is hereby corrected as shown below:

Column 1, line 41, delete "402" and insert --401--.

Column 8, line 15, delete "20".

Signed and Sealed this

First Day of June, 1999

*Attest:*

Q. TODD DICKINSON

*Attesting Officer*    *Acting Commissioner of Patents and Trademarks*